United States Patent [19]
Yamada

[11] Patent Number: 5,392,463
[45] Date of Patent: Feb. 21, 1995

[54] POWER AMPLIFIER CAPABLE OF SATURATION AND LINEAR AMPLIFICATION

[75] Inventor: Tatsuya Yamada, Tokyo, Japan

[73] Assignee: Kabushiki Kaisha Toshiba, Kawasaki, Japan

[21] Appl. No.: 777,010

[22] Filed: Oct. 16, 1991

[30] Foreign Application Priority Data

Oct. 16, 1990 [JP] Japan .................... 2-108047[U]

[51] Int. Cl.$^6$ ................ H04B 1/04; H04L 27/08; H03G 3/10
[52] U.S. Cl. .................... 455/93; 455/127; 330/284; 375/5
[58] Field of Search ........... 455/89, 93, 95, 102, 455/116, 126, 127; 330/51, 284, 285, 129, 127, 144, 145; 375/5

[56] References Cited

U.S. PATENT DOCUMENTS

| | | | |
|---|---|---|---|
| 3,984,783 | 10/1976 | Bickley | 330/40 |
| 4,234,853 | 11/1980 | Yamaguchi | 330/284 |
| 5,060,294 | 10/1991 | Schwent | 455/93 |
| 5,101,173 | 3/1992 | DiPiazza et al. | 330/144 |
| 5,179,353 | 1/1993 | Miyake | 330/129 |
| 5,241,694 | 8/1993 | Väisänen et al. | 455/126 |

FOREIGN PATENT DOCUMENTS 0390360 10/1990 European Pat. Off. .
62-235824 4/1988 Japan .

OTHER PUBLICATIONS

Fisher, "Dual Mode Mobile Unit For Next Generation Digital Narrow Channel Cellular Telephone System", 38th IEEE Vehicular Technology Conference, 17 Jun. 1988, pp. 543–547.

Henn et al., "AT & T Next Generation Digital Cellular Base Station Technology", International Switching Symposium 1990, vol. 6, 1 Jun. 1990, pp. 195–198.

Primary Examiner—Curtis Kuntz
Assistant Examiner—Mark D. Wisler
Attorney, Agent, or Firm—Banner, Birch, McKie & Beckett

[57] ABSTRACT

A power amplifier used in a mobile radio apparatus operated selectively in an analog mode and a digital mode comprises an amplifying circuit for saturation-amplifying and linear-amplifying a speech signal and a switch for selectively switching the amplifying circuit to a saturation amplification and a linear amplification in accordance with the analog mode and the digital mode.

11 Claims, 6 Drawing Sheets

POWER AMPLIFIER CAPABLE OF SATURATION AND LINEAR AMPLIFICATION

BACKGROUND OF THE INVENTION

1. Field of the Invention

The present invention relates to a power amplifier applied to a dual mode mobile radio apparatus and to a mobile radio apparatus with the power amplifier.

2. Description of the Related Art

In mobile radio communication systems such as a cellular telephone system, a portable telephone system, and a cordless telephone system, an analog communication system is conventionally applied in consideration of wave environment, circuit size, frequency utilization efficiency, and the like. In recent years, however, a shift from the analog communication system to a digital communication system has been examined. When the shift from the analog communication system to the digital communication system is to be performed, in a transition period of the shift, it is expected that a system (which employs a dual mode radio communication system) including analog and digital communication systems is used for convenience to a user of a conventional analog communication system.

In a digital communication system, a linear modulation system, e.g., a quadrature amplitude modulation system, having a high frequency-utilization-efficiency, has received a great deal of attention.

In an analog communication system, a nonlinear modulation system such as a narrow band FM system is generally employed. For this reason, in a transmitter of a conventional mobile radio apparatus, a saturated amplifier having low current consumption and a high power-added-efficiency (a ratio of DC power consumption to a radio frequency output power) is used as a power amplifier. Therefore, when a carrier linear-modulated as described above is amplified by this conventional power amplifier, distortion occurs in the carrier due to nonlinearity of the power amplifier, and transmission characteristic is considerably degraded.

In order to avoid this disadvantage, it is understood that a linear amplifier for performing class A amplification or class AB amplification is used as the power amplifier. In this linear amplifier, both of a nonlinear-modulated carrier and a linear-modulated carrier can be amplified without distortion.

However, the linear amplifier has high current consumption, therefore, low power-added-efficiency. Since a mobile radio apparatus is often driven by a battery, the increase in current consumption poses a serious problem. In this case, although total current consumption can be reduced by applying a time-division multiple access (TDMA) system in a digital communication system, an increase in current consumption cannot be easily prevented in an analog communication system.

In order to avoid these various disadvantages, it is understood that a saturated amplifier is used as a power amplifier and that distortion occurring in this saturated amplifier is compensated by adding a compensation circuit. However, this addition of the compensation circuit increases the circuit size and the size of the apparatus. Therefore, a serious disadvantage, i.e., low portability, occurs in a mobile radio apparatus. In addition, the compensation circuit has various disadvantages such as high power consumption, a high cost, and a demand of accurate adjustment in manufacturing steps.

As described above, according to a conventional power amplifier, it is difficult to preferably amplify both of a nonlinear-modulated carrier and a linear-modulated carrier. When both of the nonlinear-modulated carrier and the linear-modulated carrier are preferably amplified, the current consumption of an apparatus must be increased, or the size and cost of the apparatus must be increased.

Therefore, the above conventional mobile radio apparatus to which a power amplifier is applied has high current consumption or a large scale and a high cost.

SUMMARY OF THE INVENTION

It is an object of the present invention to provide a power amplifier which has a simple arrangement and low current consumption and can preferably amplify both of a nonlinear-modulated carrier and a linear-modulated carrier, and a mobile radio apparatus which has low current consumption and a small size and can be applied to a dual mode radio communication system.

According to the present invention, there is provided a power amplifier for selectively performing saturation amplification and linear amplification in accordance with an operation mode.

According to the present invention, there is provided a power amplifier for saturation-amplifying and linear-amplifying a transmission carrier in accordance with an analog mode and a digital mode of a dual mode communication system.

According to the present invention, there is provided a mobile radio apparatus including an analog modulator for modulating a carrier in accordance with an analog speech signal, a digital modulator for modulating a carrier in accordance with a digital speech signal, a power amplifier for saturation-amplifying an analog-modulated carrier and linear-amplifying a digital-modulated carrier, and a control circuit for selecting a saturation amplification and a linear amplification in accordance with an analog mode and a digital mode, comprising a transmitter for transmitting the speech signal to a base station and a receiver for receiving a speech signal from the base station.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

An embodiment of the present invention will be described below with reference to the accompanying drawings.

Figure 1:
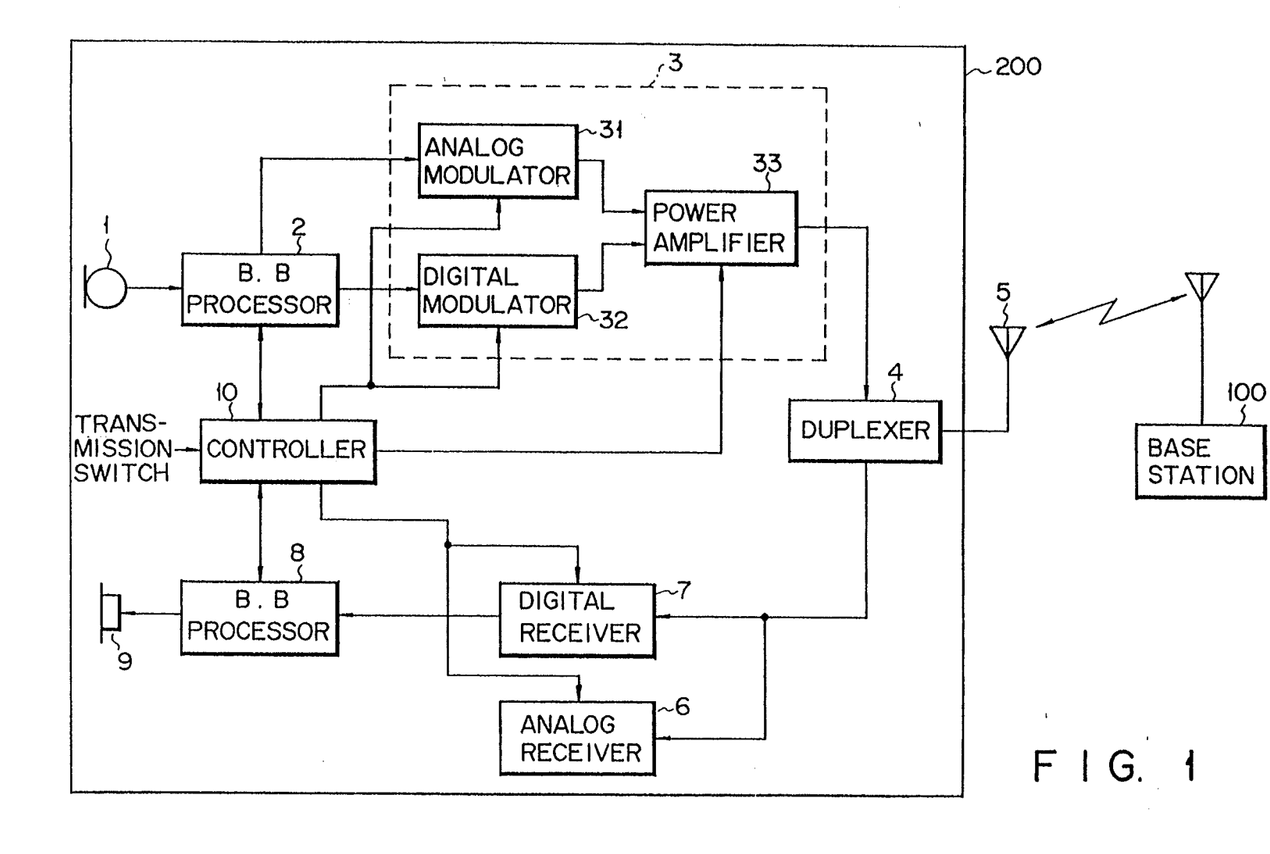
FIG. 1 is a block diagram of a mobile radio communication system using a mobile radio apparatus according to an embodiment of the present invention.

As shown in FIG. 1, a dual mode mobile radio communication system includes a base station 100 connected to a wire circuit and a mobile radio station 200, and selection of an analog mode and a digital mode is performed by only the base station 100 in accordance with a non-busy state of a communication channel. Although one base station and one mobile station are exemplified in this embodiment, a plurality of base stations and a plurality of mobile stations are arranged in a practical communication system.

The mobile radio station 200, i.e., a mobile radio set, is divided into a transmission line and a reception line. The transmission line is constituted by a microphone 1, a base band processor (B.B processor) 2, a transmitter 3, a duplexer 4, and an antenna 5.

The transmitter 3 is constituted by an analog modulator 31, a digital modulator 32, and a power amplifier 33. A speech signal output from the microphone 1 and control data output from a controller 10 are received by the analog modulator 31 through the base band processor 2, and the analog modulator 31 performs non-linear modulation (in this embodiment, FM modulation) of a carrier in accordance with the speech signal and the control data. Similarly, a speech signal output from the microphone 1 and control data output from the controller 10 are received by the digital modulator 32 through the base band processor 2. In this case, the base band processor 2 performs coding or the like of the speech signal output from the microphone 1 and the control data output from the controller 10 to form a coded speech signal and coded control data so as to output the signal and data to the digital modulator 32. The digital modulator 32 linear-modulates (in this embodiment, quadrature amplitude modulation) the carrier in accordance with the coded speech signal and the coded control data.

The controller 10 alternatively operates the analog modulator 31 and the digital modulator 32 in accordance with a communication mode as described above and controls the power amplifier 33 such that an output signal from the analog modulator 31 or the digital modulator 32 is amplified to a sufficient level enough to perform radio transmission. A transmission signal obtained by the transmitter 3 is supplied from the antenna 5 to a radio link through the duplexer 4.

The reception line is constituted by the antenna 5, the duplexer 4, an analog receiver 6, a digital receiver 7, a base band processor (B.B processor) 8, and an earphone 9. The antenna 5 receives a modulated carrier transmitted from the base station 100 through a radio link and then supplies the received signal obtained by this reception operation to the analog receiver 6 and the digital receiver 7 through the duplexer 4. The analog receiver 6 is constituted by a filter and an analog demodulator (although not shown) and FM-demodulates a received given signal to reproduce a speech signal and control data. The analog receiver 6 supplies the received signal and control data which are reproduced to the B.B processor 8. The B.B processor 8 supplies the received signal and the control data to the earphone 9 and the controller 10, respectively.

The digital receiver 7 is constituted by a filter and a digital demodulator (although not shown) and quadrature-amplitude-modulates a received given signal to reproduce a coded speech signal and coded control data. The analog receiver 6 and the digital receiver 7 are alternately operated by the controller 10 in accordance with a communication mode. The base band processor 8 decodes the coded speech signal and the coded control data which are reproduced by the digital receiver 7 to reproduce a speech signal and control data. The base band processor 8 supplies the speech signal and control data to the earphone 9 and the controller 10, respectively.

The controller 10 has, e.g., a microcomputer 9, as a main control circuit and, in addition to a general radio line connection control function, a function of determining and instructing the operation characteristics of the power amplifier 33 in accordance with whether a communication mode is an analog mode or a digital mode.

Figure 2A:
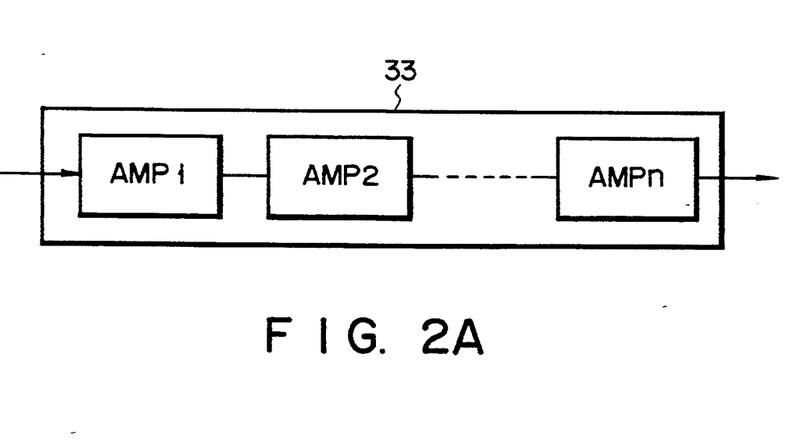
FIG. 2A is a block diagram of a power amplifier shown in FIG. 1.
Figure 2B:
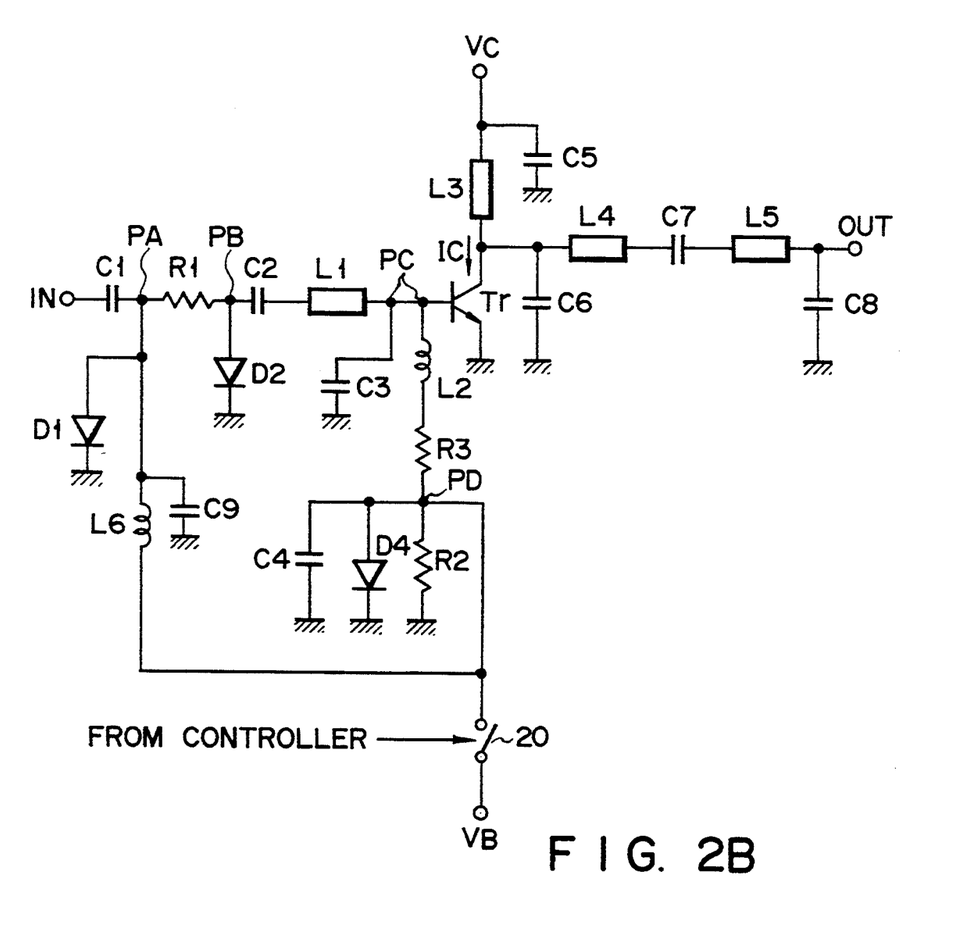
FIG. 2B is a circuit diagram of the last stage transistor circuit in FIG. 2A.

As shown in FIG. 2A, the power amplifier 33 is constituted by a multistage amplifier having a plurality of transistor amplifier circuits AMP1, AMP2, . . . AMPn. FIG. 2B shows the last stage transistor amplifier circuit.

According to the last stage transistor amplifier circuit in FIG. 2B, an input terminal IN connected to the output terminal of a previous transistor circuit is connected to the base terminal of a transistor Tr through a coupling capacitor C1, a resistor R1, a capacitor C2, and a distributed inductor L1 for obtaining an impedance matching the previous transistor amplifier circuit in relation to a capacitor C3. A point PA connected to the coupling capacitor C1 and the resistor R1 is grounded through a PIN diode D1 and a capacitor C9. A DC bias voltage VB having a predetermined potential is applied to the point PA through a switch 20 ON/OFF- controlled by the controller 10 and a choke coil L6.

A point PB connected to the resistor R1 and the capacitor C2 is grounded through a PIN diode D2. A point PC connected to the distributed inductor L1 and the transistor Tr is grounded through the capacitor C3. A voltage obtained by dividing the DC bias voltage VB by resistors R2 and R3 is applied to the point PC through a concentrated inductor constituted by a coil L2 and the resistor R3.

A point PD connected to the resistor R2 and the resistor R3 is grounded through a diode D4 for temperature compensation and a capacitor C4 for removing an AC component of the DC bias voltage VB.

A DC bias voltage VC having a predetermined value is applied to the collector terminal of the transistor Tr through an inductor L3. Note that a capacitor C5 is a capacitor for removing an AC component from the DC bias voltage VC. The collector terminal of the transistor Tr is grounded through a capacitor C6. In addition, the collector terminal of the transistor Tr is connected to an output terminal OUT through an inductor L4, a capacitor C7, and an inductor L5. The output terminal OUT is grounded through a capacitor C8. The capacitor C6, the inductor L4, the capacitor C7, the inductor L5, and the capacitor C8 constitute a circuit for obtaining impedance matching. The emitter terminal of the transistor Tr is grounded.

An operation of the mobile radio apparatus arranged as described above will be described below in accordance with a control sequence of the controller 10.

Figure 3:
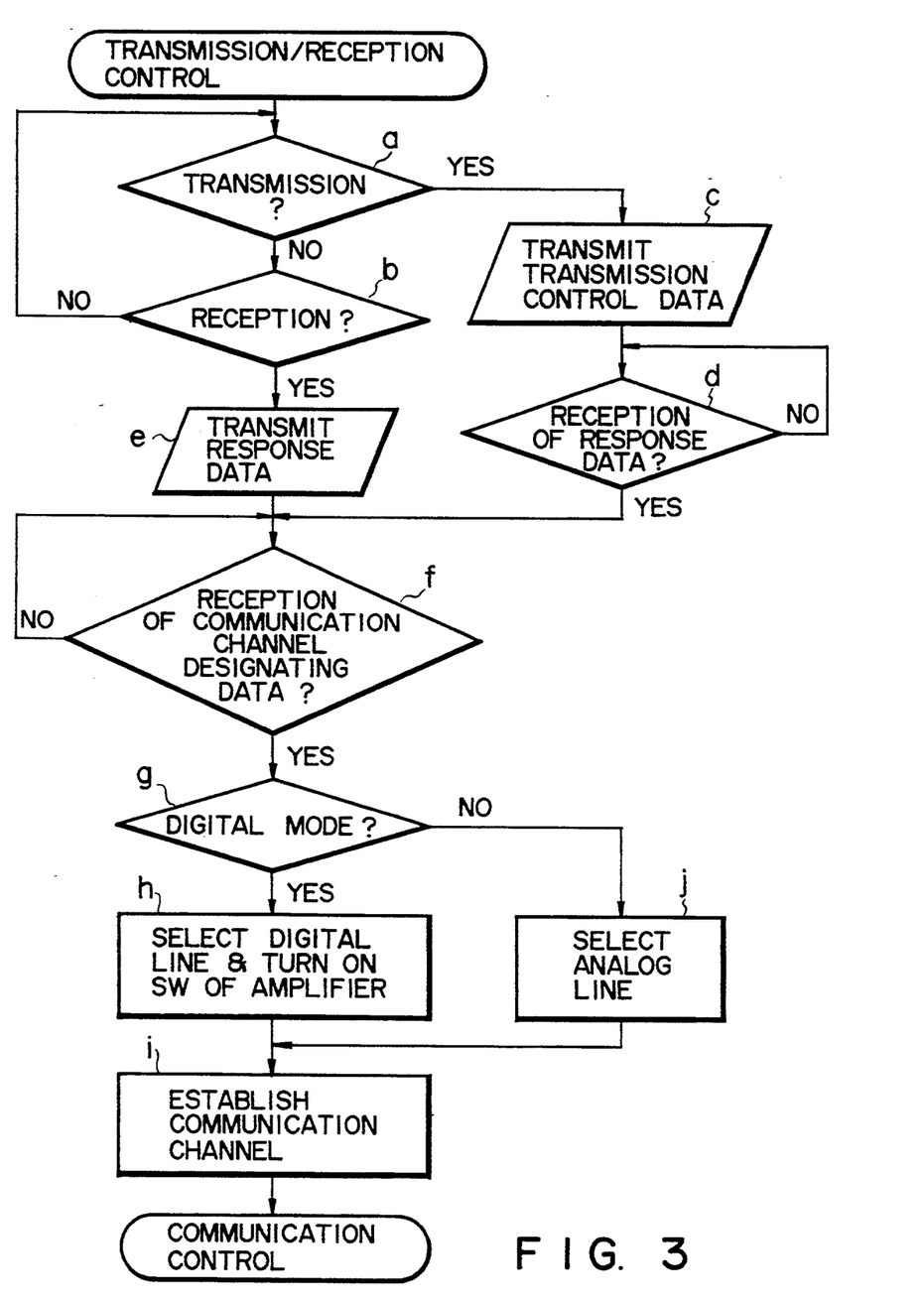
FIG. 3 is a flow chart showing a processing sequence in transmission/reception control of a controller shown in FIG. 1.

First, in a reception stand-by condition, the controller 10 repeatedly monitors whether a transmission operation is performed as shown in steps a and b of FIG. 3 and whether reception control data is received from the base station 100.

In this state, if a user operates a transmission switch (not shown) to perform a transmission operation, the flow of the controller 10 advances from step a to step c. In step c, the controller 10 forms transmission control data including various data such as the ID number of a transmitter required for transmission, and the controller 10 outputs these data to the B.B processor 2. The transmission control data is transmitted from the antenna 5 to the base station 100 through the receiver 3 and the duplexer 4. After the transmission control data is transmitted, the controller 10 waits for response data from the base station 100 in step d.

when the response data is transmitted from the base station 100, this response data is received by the antenna 5, the duplexer 4, and the analog receiver 6 or the digital receiver 7 and supplied to the controller 10. At this time, the flow of the controller 10 advances from step d to step f.

In a reception stand-by condition, when reception control data is transmitted form the base station 100, the controller 10 receives the control data, and the flow of the controller 10 advances from step b to step e. In step e, the controller 10 forms response data corresponding to the reception control data and supplies the response data to the base station 100 through the duplexer 4 and the antenna 5. Thereafter, the flow of the controller 10 advances to step f.

In step f, the controller 10 waits for communication channel designating data from the base station 100. When the communication channel designating data is transmitted from the base station 100 and received by the mobile radio apparatus 200, in step g, the controller 10 determines a mode of a designated communication channel in accordance with the communication channel designating data. When the communication channel is a digital mode channel, the flow of the controller 10 advances to step h. In step h, the controller 10 operates the digital modulator 32 and the digital receiver 7 and stops the operations of the analog modulator 31 and the analog receiver 6. That is, the controller 10 sets the mobile radio apparatus in a digital mode and turns on the switch 20 (normally set in an OFF state) of the power amplifier 33. Thereafter, the flow of the controller 10 advances to step i.

When the controller 10 determines that the communication channel is set in an analog mode in step g, in step j, the analog modulator 31 and the analog receiver 6 are operated, and the operations of the digital modulator 32 and the digital receiver 7 are stopped. That is, the controller 10 sets the mobile radio apparatus 200 in the analog mode. At this time, the switch 20 of the power amplifier 33 is set in an OFF state. Thereafter, the flow of the controller 10 advances to step i.

After the mobile radio apparatus 200 is set in the digital mode or the analog mode, in step i, the controller 10 performs the well-known speech communication channel establishing control such as a synchronizing operation and a training operation. When the speech communication channel is established by this control, the operation of the mobile radio apparatus advances to speech communication control.

When the speech communication channel is established, speech communication is performed between the mobile radio apparatus 200 and a called terminal connected to the mobile radio apparatus 200. That is, a voice uttered by a user is converted into a speech signal by the microphone 1 and radio-transmitted to the base station 100 through the base band processor 2, the transmitter 3, the duplexer 4, and the antenna 5. In addition, the speech signal is supplied to the called terminal connected to the base station 100 through a wire line or a radio line. A speech signal output from the called terminal is radio-transmitted from the base station 100.

In the mobile radio apparatus 200, the signal transmitted from the base station 100 is received by the analog receiver 6 or the digital receiver 7 through the antenna 5 and the duplexer 4. The receiver 6 or 7 demodulates the received signal and reproduced into a speech signal to be transmitted to the base band processor 8. A voice corresponding to the reproduced speech signal is output from the earphone 9.

In this speech communication state, operations of the respective parts of the transmission line will be further described. A speech signal output from the microphone 1 is input to the base band processor 2. The base band processor 2 performs coding or the like of the input speech signal to form a modulating signal and supplies it to the analog modulator 31 or the digital modulator 32. The analog modulator 31 or the digital modulator 32 is set in an ON state in accordance with a communication mode of a designated communication channel. Therefore, when this communication mode is an analog mode, a signal obtained by FM-modulating a carrier by the modulating signal in the analog modulator 31 is input to the power amplifier 33. In a digital mode, a signal obtained by quadrature-amplitude-modulating a carrier by the modulating signal in the digital modulator 32 is input to the power amplifier 33.

Figure 4:
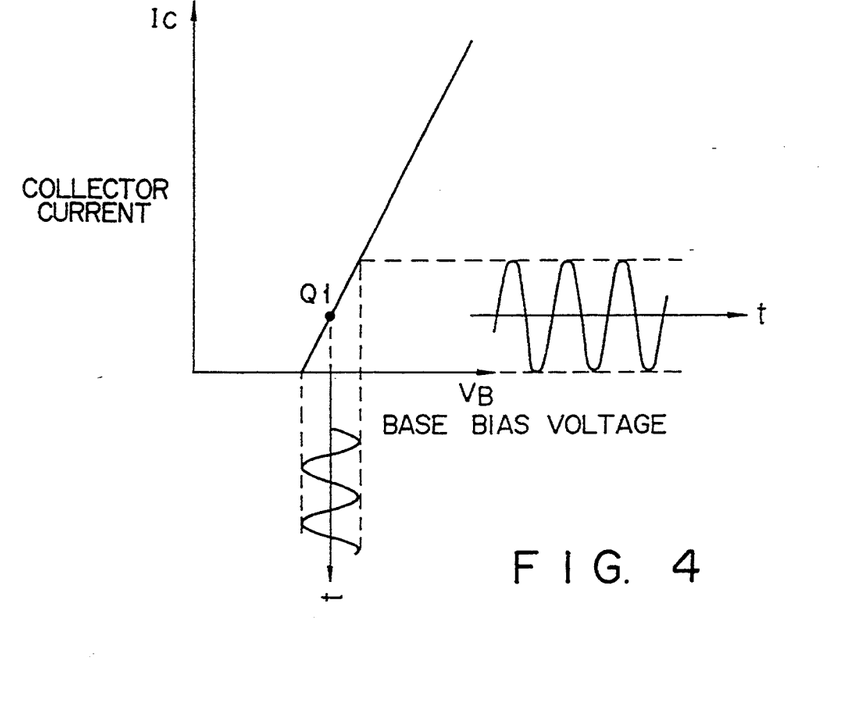
FIG. 4 is a graph showing current-voltage characteristics in a saturation amplifier.

The power amplifier 33 outputs a speech signal having a level higher than that of an input signal through the output terminal OUT by the amplifying operation of the transistor Tr in accordance with the input signal input to the input terminal IN. At this time, when a digital mode is used, i.e., when the input signal is a quadrature amplitude modulated signal, as described above, the switch 20 is turned on by the controller 10. Therefore, the DC bias voltage VB is superposed on the input signal, and the power amplifier 33 performs class A amplification or class AB amplification (determined by the level of the DC bias voltage VB) shown in FIG. 4, i.e., the power amplifier 33 is operated as a linear amplifier. In this linear amplification, the input signal has a sufficient level and may be distorted. However, since the DC bias voltage VB is applied to the PIN diodes D1 and D2, the PIN diodes D1 and D2 have a relatively low resistance component, the input signal is relatively largely attenuated to decrease the signal level. Therefore, the input signal is not distorted.

Figure 5:
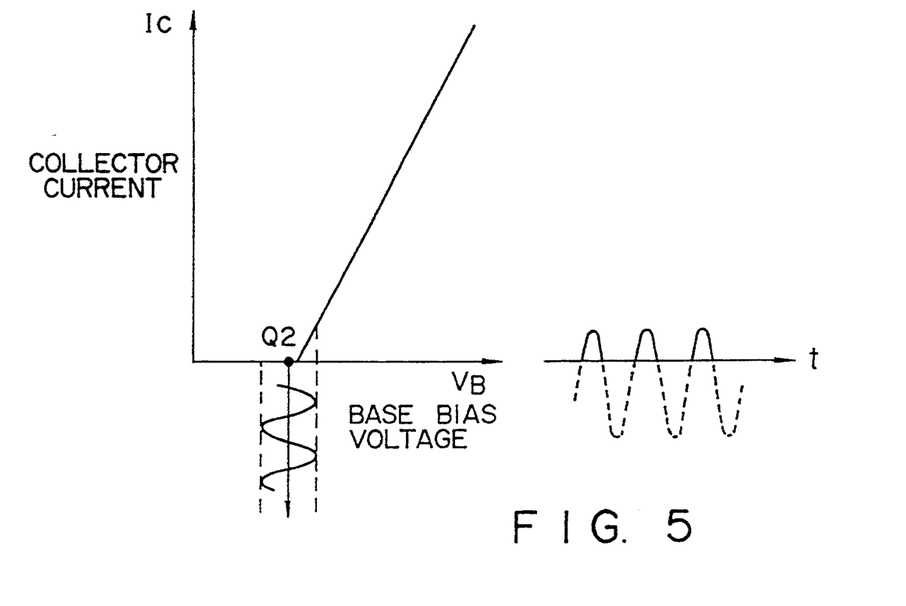
FIG. 5 is a graph showing current-voltage characteristics in a linear amplifier.

When an analog mode is used, i.e., when an input signal is FM-modulated, as described above, the switch 20 is turned off by the controller 10. Therefore, the DC bias voltage VB is not superposed on the input signal, and the power amplifier 33 performs class C amplification shown in FIG. 5, i.e., the power amplifier 33 is operated as a saturation amplifier. At this time, since the DC bias voltage VB is not applied to the PIN diodes D1 and D2, the PIN diodes D1 and D2 have a relatively high resistance component, and a small amount of attenuation occurs in the input signal by the PIN diodes D1 and D2. Therefore, the signal having a sufficient level is input to the transistor Tr. Thus, the PIN diodes D1 and D2 constitute an attenuator for attenuating an input signal in an attenuation amount corresponding to the level (in this case, ON/OFF) of a DC bias voltage superposed on the input signal.

A transmission signal obtained by performing amplification in the power amplifier 33 is radio-transmitted from the antenna 5 through the duplexer 4.

As described above, according to this embodiment, the power amplifier 33 can be operated as a linear amplifier in a digital mode, and the power amplifier 33 can be operated as a saturated amplifier in an analog mode. Therefore, by using the power amplifier 33 having a simple arrangement, a quadrature amplitude modulated signal can be amplified without distortion in the digital mode, and an FM-modulated signal can be amplified with a high power-added-efficiency in the analog mode. That is, both of the quadrature amplitude modulated signal and the FM-modulated signal can be preferably amplified without causing an increase in the number of circuits, an increase in size, and an increase in cost which are caused by adding a compensation circuit and the like.

In this embodiment, the bias of the last stage transistor amplifier circuit of the power amplifier 33 is switched. The switched bias is not limited to the bias of the last stage transistor amplifier circuit, and a bias switching circuit may be arranged in the transistor amplifier circuit previous to the last stage one.

Figure 6:
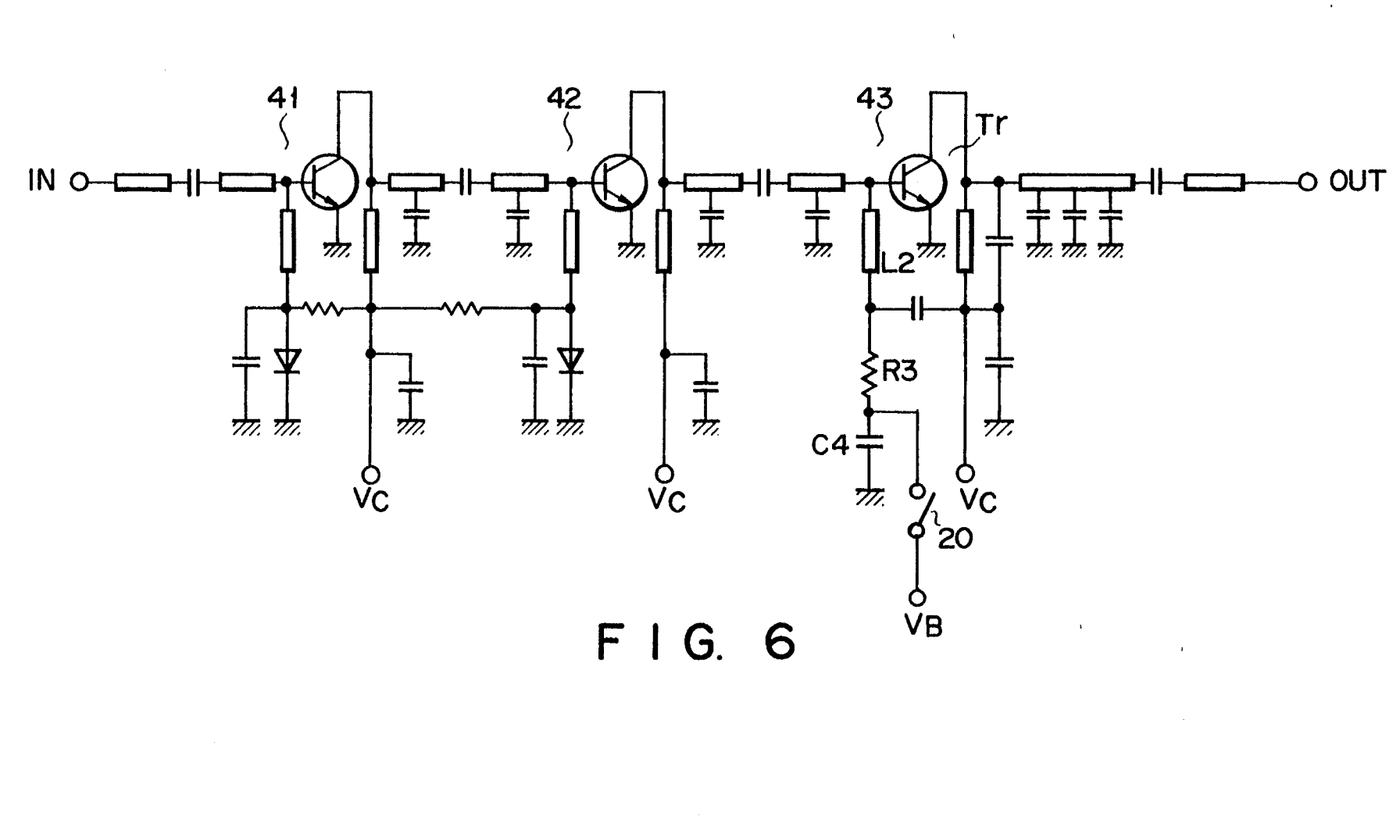
FIG. 6 is a circuit diagram showing a power amplifier module used in the mobile radio apparatus in FIG. 1.

FIG. 6 shows a circuit of a high-frequency power amplifier according to another embodiment. According to this circuit, a power amplifier is constituted by three stage transistor amplifier circuits 41, 42, and 43. The first and second stage transistor amplifier circuits 41 and 42 operate as linear amplifiers for performing class AB amplification, and the last stage transistor amplifier circuit 43 operates as a linear amplifier or a saturated amplifier for performing class C amplification in accordance with on or off operation of a switch 20. That is, when the switch 20 is turned off, the last stage transistor amplifier circuit 43 operates as a linear amplifier. When the switch 20 is turned on, the bias voltage VB is applied to the base of the transistor Tr through the switch 20, resistor R3 and the inductor L2, so that the amplifier circuit 43 operates as a saturated amplifier.

When the above power amplifier is constituted as a module, in order to know whether the power amplifier module appropriately operates or not, the following examination is performed.

Figure 7:
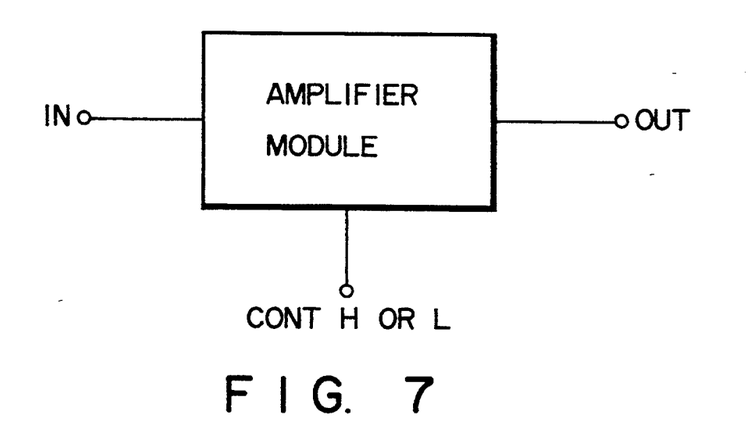
FIG. 7 is a circuit diagram for measuring input/output characteristics of the power amplifier module.
Figure 8:
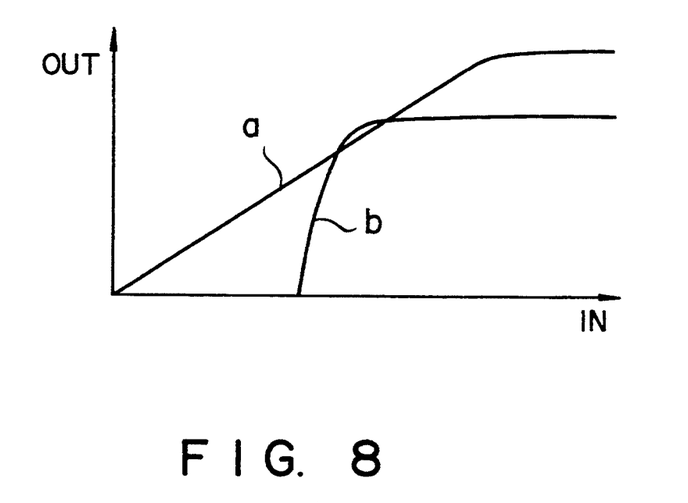
FIG. 8 is a graph showing the input/output characteristics of the power amplifier module in FIG. 7.

An input signal is supplied to the input terminal IN of the power amplifier module shown in FIG. 7, and the level of the input signal is changed. At this time, an output signal output from the output terminal OUT of the power amplifier module is measured. When the output signal is linearly changed with respect to a change in input signal as indicated by a line a of FIG. 8, the power amplifier module operates as a linear amplifier. When the output signal changes so as to steeply increase from a given value of the input signal and saturate as indicated by a curve b of FIG. 8, the power amplifier module operates as a saturated amplifier. The linear operation and the saturation operation are switched by switching a switching signal supplied to a control terminal to "H" or "L".

In the above embodiment, although a power amplifier is applied to a mobile radio apparatus, the power amplifier according to the present invention can be applied to other apparatuses than the mobile radio apparatus.

In the above embodiment, the PIN diodes D1 and D2 are applied to an attenuating circuit, another circuit element such as a variable resistor may be applied to the attenuating circuit. In addition, in the above embodiment, although an input signal is attenuated by an attenuating circuit constituted by the PIN diodes D1 and D2 in a linear operation, the attenuating circuit may be omitted depending on the level of the input signal.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A power amplifier used in a mobile radio apparatus operated selectively in an analog mode and a digital mode, comprising:
   amplifying circuit means for saturation-amplifying and linear-amplifying an input signal, wherein said amplifying circuit means includes signal attenuating means for attenuating the input signal in accordance with a control signal indicating the analog mode or the digital mode, and a transistor for receiving the input signal input through said attenuating means; and switching means for switching said amplifying circuit means to selectively perform a saturation amplification and a linear amplification in accordance with the analog mode and the digital mode, said switching means connected to a base of said transistor.

2. An amplifier according to claim 1, wherein said signal attenuating means sets signal attenuation amounts such that a signal attenuation amount of the saturation amplification is smaller than that of the linear amplification.

3. An amplifier according to claim 1, wherein said amplifying circuit means is constituted by a plurality of transistor circuits for amplifying the input signal, and said switching means is constituted by means for applying a base bias voltage to at least one of said transistor circuits.

4. An amplifier according to claim 3, wherein said switching means includes means for applying the base bias voltage to a last one of said transistor circuits.

5. An amplifier according to claim 1, wherein said switching means includes a switch, connected to a bias power source and closed in a digital mode, for applying a bias voltage to the base of said transistor.

6. A mobile radio apparatus comprising:
   a transmitter for transmitting a modulated signal to a base station;
   said transmitter including an analog modulator for modulating an analog input signal, a digital modulator for modulating a digital input signal, a power amplifier for saturation-amplifying an analog-modulated carrier and linear-amplifying a digital-modulated carrier, wherein said power amplifier includes signal attenuating means for attenuating the analog-modulated carrier and the digital-modulated carrier by a signal attenuation amount in accordance with a control signal indicating the analog mode and the digital mode, and selecting means for selecting a saturation amplification and a linear amplification in accordance with the analog mode and the digital mode; and a receiver for receiving a transmission signal from said base station.

7. An apparatus according to claim 6, wherein said power amplifier is constituted by amplifying circuit means for saturation-amplifying and linear-amplifying the analog-modulated carrier and the digital-modulated carrier and switching means for switching said amplifying circuit means to perform the saturation amplification and the linear amplification in accordance with the analog mode and the digital mode. than that of the linear amplification.

8. An apparatus according to claim 6, wherein said signal attenuating means sets signal attenuation amounts such that an attenuation amount of the saturation amplification is smaller than that of the linear amplification.

9. An apparatus according to claim 6, wherein said power amplifier is constituted by a multistage amplifier having a plurality of transistor circuits including a last stage transistor circuit, for amplifying the input signal, and said switching means is constituted by means for applying a base bias voltage to at least one of said transistor circuits in the digital mode.

10. An apparatus according to claim 9, wherein said switching means includes means for applying the base bias voltage to said last stage transistor circuit.

11. An amplifier according to claim 6, wherein said amplifying circuit means includes a transistor, having a base connected to said switching means, for receiving the analog-modulated carder and the digital modulated carrier input through said attenuating means, and said switching means includes a switch, connected to a bias power source and closed in the digital mode, for applying the bias voltage to the base of said transistor.

* * * * *